(12) United States Patent
Zhou et al.

(10) Patent No.: US 11,914,166 B2
(45) Date of Patent: *Feb. 27, 2024

(54) SYSTEMS AND METHODS FOR ALIGNMENT OF WAVELENGTH BEAM COMBINING RESONATORS

(71) Applicant: Panasonic Intellectual Property Management Co., Ltd., Osaka (JP)

(72) Inventors: Wang-Long Zhou, Andover, MA (US); Bien Chann, Merrimack, NH (US); Krzysztof Michal Nowak, Andover, MA (US); Francisco Villarreal-Saucedo, Middleton, MA (US)

(73) Assignee: PANASONIC INTELLECTUAL PROPERTY MANAGEMENT CO., LTD, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/890,859

(22) Filed: Aug. 18, 2022

(65) Prior Publication Data

US 2022/0390759 A1 Dec. 8, 2022

Related U.S. Application Data

(63) Continuation of application No. 16/751,743, filed on Jan. 24, 2020, now Pat. No. 11,454,821.

(60) Provisional application No. 62/797,438, filed on Jan. 28, 2019.

(51) Int. Cl.
   *G02B 27/42* (2006.01)
   *G02B 7/14* (2021.01)

(52) U.S. Cl.
   CPC ........... *G02B 27/4255* (2013.01); *G02B 7/14* (2013.01)

(58) Field of Classification Search
   CPC .............................. G02B 27/4255; G02B 7/14
   USPC .......................................................... 359/566
   See application file for complete search history.

(56) References Cited

U.S. PATENT DOCUMENTS

| | | | |
|---|---|---|---|
| 8,488,245 B1 | 7/2013 | Chann et al. | |
| 11,454,821 B2 | 9/2022 | Zhou et al. | |
| 2003/0150997 A1 | 8/2003 | Eckert et al. | |
| 2004/0017624 A1 | 1/2004 | Herkommer | |
| 2006/0067611 A1 | 3/2006 | Frisken et al. | |
| 2011/0216792 A1 | 9/2011 | Chann et al. | |
| 2011/0310921 A1* | 12/2011 | Chann ..................... H01S 5/405 359/558 |
| 2012/0105968 A1 | 5/2012 | Chann et al. | |

(Continued)

FOREIGN PATENT DOCUMENTS

| | | |
|---|---|---|
| CN | 102916341 a | 2/2013 |
| CN | 104155771 A | 11/2014 |

(Continued)

OTHER PUBLICATIONS

International Search Report and Written Opinion Corresponding to International Application No. PCT/US2020/014946, dated May 27, 2020, 19 pages.

*Primary Examiner* — Wyatt A Stoffa
*Assistant Examiner* — Mitchell T Oestreich
(74) *Attorney, Agent, or Firm* — Morgan, Lewis & Bockius LLP

(57) ABSTRACT

In various embodiments, alignment systems for laser resonators generate near-field and/or far-field images of input beams produced by the laser resonators to enable the alignment of the input beams.

27 Claims, 8 Drawing Sheets

(56) References Cited

U.S. PATENT DOCUMENTS

| | | |
|---|---|---|
| 2013/0208361 A1 | 8/2013 | Chann et al. |
| 2013/0215517 A1 | 8/2013 | Tayebati et al. |
| 2014/0240831 A1 | 8/2014 | Chann |
| 2015/0003484 A1 | 1/2015 | Muendel |
| 2015/0253577 A1 | 9/2015 | Liebowitz et al. |
| 2015/0331245 A1 | 11/2015 | Tayebati et al. |
| 2015/0333485 A1 | 11/2015 | Tayebati et al. |
| 2015/0364900 A1 | 12/2015 | Chann et al. |
| 2016/0111850 A1 | 4/2016 | Muendel et al. |
| 2016/0377874 A1 | 12/2016 | Zhou et al. |
| 2017/0199389 A1 | 7/2017 | Liu et al. |
| 2020/0241313 A1 | 7/2020 | Zhou et al. |

FOREIGN PATENT DOCUMENTS

| | | |
|---|---|---|
| JP | H04-120780 A | 4/1992 |
| JP | 2016-337923 A | 12/2006 |
| KR | 10-1399985 B1 | 5/2014 |

\* cited by examiner (WBC DIMENSION)

FIG. 2 (WBC DIMENSION)

(NON-WBC DIMENSION)

(NON-WBC DIMENSION)

(NON-WBC DIMENSION)

SYSTEMS AND METHODS FOR ALIGNMENT OF WAVELENGTH BEAM COMBINING RESONATORS

RELATED APPLICATIONS

This application is a continuation of U.S. patent application Ser. No. 16/751,743, filed Jan. 24, 2020, which claims the benefit of and priority to U.S. Provisional Patent Application No. 62/797,438, filed Jan. 28, 2019, the entire disclosure of each of which is hereby incorporated herein by reference.

TECHNICAL FIELD

In various embodiments, the present invention relates to laser systems, specifically methods and systems for alignment of laser systems with multiple beam emitters.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. Optical systems for laser systems are typically engineered to produce the highest-quality laser beam, or, equivalently, the beam with the lowest beam parameter product (BPP). The BPP is the product of the laser beam's divergence angle (half-angle) and the radius of the beam at its narrowest point (i.e., the beam waist, the minimum spot size). That is, BPP=NA×D/2, where D is the focusing spot (the waist) diameter and NA is the numerical aperture; thus, the BPP may be varied by varying NA and/or D. The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, which is a wavelength-independent measure of beam quality.

Wavelength beam combining (WBC) is a technique for scaling the output power and brightness from laser diodes, laser diode bars, stacks of diode bars, or other lasers arranged in a one- or two-dimensional array. WBC methods have been developed to combine beams along one or both dimensions of an array of emitters. Typical WBC systems include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein.

Various WBC laser systems combine beams emitted by beam emitters along a single direction, or dimension, termed the "WBC dimension." Accordingly, WBC systems, or "resonators," often feature their various components lying in the same plane in the WBC dimension. The dimension perpendicular to the WBC dimension, in which the beams are not combined, is typically termed the "non-WBC dimension."

As disclosed in some of the references mentioned above, WBC laser systems often feature diode bars, or other multi-beam emitters, the outputs of which are combined into a single output beam. A typical WBC resonator includes a dispersion element and a downstream feedback surface, which provides (e.g., by reflection) a feedback beam to each corresponding emitter to stabilize the resonator by locking each emitter to its corresponding lasing wavelength. In order to optimize the WBC resonator, the combined beam in the resonator is generally aligned to be normal to the feedback surface in both WBC and non-WBC dimensions.

Advantageously, WBC resonators are often self-adaptive to certain degree of misalignment in the WBC dimension, because the resonator will simply lock to a different wavelength propagating in the direction normal to the feedback surface in the WBC dimension. If the new lasing wavelength is within a substantially flat region of the emitter gain curve and the misalignment is not causing noticeable power clipping on the optics in the resonator, misalignment in WBC dimension will often not affect resonator power and stability.

However, the alignment of the WBC resonator in the non-WBC dimension is more challenging. Since the WBC resonator is effectively an assembly of many independent single-beam resonators, each single-beam resonator would ideally be aligned independently. Particularly in systems in which the emitters are diode bars or other multi-emitter sources, WBC resonator performance relies on the alignment of individual sub-resonators corresponding to the individual diode bars. Thus, there is a need for systems and methods that enable the optimized alignment of WBC resonators and the beam sources thereof, particularly in the non-WBC dimension.

SUMMARY

Systems and techniques in accordance with embodiments of the present invention detect and enable alleviation of emitter misalignment in laser resonators (e.g., WBC resonators) in which the beams from multiple beam emitters are spatially overlapped. In accordance with various embodiments, a resonator beam (e.g., a WBC resonator beam) is de-multiplexed, and near-field and far-field images of the resulting sub-beams are generated (either serially or simultaneously) via a beam profiling system. The resulting images reveal beam decentering and pointing errors that may be reduced or substantially eliminated via adjustment of one or more optical elements in the laser system. For example, interleaver mirrors may be tilted, and/or lenses (e.g., SAC lenses or other lenses adjusting the beam in the slow axis and/or non-WBC dimension) may be translated to adjust the alignment of individual beams.

As utilized herein, a "near-field image" corresponds to an image of a beam or sub-beam at the beam output (e.g., the output of a laser resonator). Typically, in the near-field, beams are relatively collimated and have relatively large beam sizes. In various embodiments, near-field images may be produced via a projection of a beam or sub-beam, through no lenses having optical power in the WBC dimension (or, alternatively, another dimension of interest for imaging), onto the beam profiling system. (In various embodiments, such beams or sub-beams may still propagate through lenses having no optical power in the WBC dimension to produce near-field images.) In other embodiments, near-field images may be produced by imaging the beam or sub-beam at the beam output with an imaging lens (i.e., a lens having optical power in the WBC dimension and that may be located an optical distance away from the beam output that corresponds to its focal length) onto the beam profiling system. Near-field images may be utilized to monitor and determine the shape and size of beams or sub-beams at the beam output.

In contrast, a "far-field image" corresponds to an image of a beam or sub-beam at the focal plane of a lens, e.g., a lens located optically downstream of the beam output. In various embodiments, far-field images may be produced via focusing of the beam or sub-beam with a lens, which may be located an optical distance away from the beam profiling system that corresponds to the focal length of the lens, onto the beam profiling system. Far-field images may be utilized to monitor and determine the beam pointing (corresponding to the beam position at the beam profiling system) and divergence (corresponding to the beam size at the beam profiling system) of beams or sub-beams.

Alignment systems in accordance with various embodiments of the present invention feature optical elements (e.g., lenses, beam splitters, reflectors, and/or beam rotators) that may be, but are not necessarily, movable into and out of the path of the output beam of the resonator. The optical elements, and their positioning and/or movement, enable both far-field and near-field images to be generated with the beam profiling system. This also enables detection and correction of misalignment in both the WBC and non-WBC dimensions, as the output beam may be rotated by a beam rotator moved into the path of the beam. That is, de-multiplexing of the unrotated beam may be used to detect misalignment in, e.g., the non-WBC dimension, and de-multiplexing of the rotated beam may be used to detect misalignment in, e.g., the WBC dimension. Optical elements may be movable (e.g., translatable and/or tiltable) via use of mechanized stages, gimbals, platforms, and/or mounts, as are known in the art; thus, provision of movable optical elements may be accomplished by those of skill in the art without undue experimentation.

Since many laser resonators utilize individual beams that are spatially overlapped at the resonator output, alignment of such systems typically requires the powering up of only a single emitter (e.g., diode bar) at a time, and only that resulting beam (or set of beams) is adjusted to optimize the resulting sub-resonator established by the beam(s). In contrast, embodiments of the present invention advantageously de-multiplex spatially overlapped beams so that one or more, or even all, of the beams may be aligned at the same time. In this manner, embodiments of the invention enable the more efficient alignment of multi-emitter laser resonators. In addition, since individual powering of single emitters is not required by embodiments of the present invention for alignment, the laser resonator power supply and power-switching configuration may be simplified.

Systems and techniques in accordance with embodiments of the invention may be utilized with WBC resonators that include multiple diode bars as beam emitters. Each beam emitter may have a corresponding interleaver mirror and slow-axis collimation (SAC) lens, and the beams from all of the emitters may be combined optically downstream into a multi-wavelength output beam. Each diode bar may be coupled with a fast-axis collimator and an optical rotator (or "optical twister"), which rotate the fast and slow axes of the beams by 90° in the plane normal to the beam propagation direction. In such WBC systems, the slow axis of the beams is in the non-WBC dimension or direction optically downstream of the optical rotator. Thus, the emitters of a single diode bar may all be collimated in the slow axis by a single SAC lens (or "slow-axis collimator").

Embodiments of the invention may be utilized to detect and compensate slow-axis pointing errors induced by, for example, tilt of a dispersive element in a WBC system in the non-WBC direction, as detailed in U.S. patent application Ser. No. 16/598,001, filed on Oct. 10, 2019 (the '001 application), the entire disclosure of which is incorporated by reference herein. In addition, embodiments of the invention may be utilized to detect and then reduce or substantially eliminate beam smear using arrays of SAC lenses that are "staircased," i.e., varying in height and/or position relative to each other, as detailed in the '001 application.

In embodiments of the invention, beam emitters (or simply "emitters") may include, consist essentially of, or consist of diode lasers, fiber lasers, fiber-pigtailed diode lasers, etc., and may be packaged individually or in groups as one- or two-dimensional arrays. In various embodiments, emitters or emitter arrays are high-power diode bars with each bar having multiple (e.g., tens of) emitters. The emitters may have micro-lenses attached thereto for emitter collimation and beam shaping. Transform optics, normally confocal and positioned between the emitters and a dispersive element (e.g., a diffraction grating), collimate individual beams from different emitters and converge all the chief rays of the beams toward the center of the grating, particularly in the WBC dimension (i.e., the dimension, or direction, in which the beams are combined). The main beam diffracted by the dispersive element propagates to a partially reflective output coupler, which provides feedback to individual emitters and defines wavelengths of individual emitters via the dispersive element. That is, the coupler reflects a portion of the various beams back to their individual emitters, thereby forming external lasing cavities, and transmits the combined multi-wavelength beam for applications such as welding, cutting, machining, processing, etc. and/or for coupling into one or more optical fibers.

Various embodiments of the invention may be utilized with laser systems featuring techniques for varying BPP of their output laser beams, such as those described in U.S. patent application Ser. No. 14/632,283, filed on Feb. 26, 2015, and U.S. patent application Ser. No. 15/188,076, filed on Jun. 21, 2016, the entire disclosure of each of which is incorporated herein by reference. Laser systems in accordance with embodiments of the invention may also include power and/or spectral monitoring functionality, as detailed in U.S. patent application Ser. No. 16/417,861, filed on May 21, 2019, the entire disclosure of which is incorporated herein by reference.

Herein, "optical elements" may refer to any of lenses, mirrors, prisms, gratings, beam splitters, and the like, which redirect, reflect, bend, or in any other manner optically manipulate electromagnetic radiation, unless otherwise indicated. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams. The input beams received in the embodiments herein may be single-wavelength or multi-wavelength beams combined using various techniques known in the art.

Although diffraction gratings are utilized herein as exemplary dispersive elements, embodiments of the invention may utilize other dispersive elements such as, for example, dispersive prisms, transmission gratings, or Echelle gratings. Embodiments of the invention may utilize one or more prisms in addition to one or more diffraction gratings, for example as described in U.S. patent application Ser. No. 15/410,277, filed on Jan. 19, 2017, the entire disclosure of which is incorporated by reference herein.

Embodiments of the present invention may couple multi-wavelength output beams into an optical fiber. In various embodiments, the optical fiber has multiple cladding layers surrounding a single core, multiple discrete core regions (or "cores") within a single cladding layer, or multiple cores surrounded by multiple cladding layers. In various embodiments, the output beams may be delivered to a workpiece for applications such as cutting, welding, etc.

Laser diode arrays, bars and/or stacks, such as those described in the following general description may be used in association with embodiments of the innovations described herein. Laser diodes may be packaged individually or in groups, generally in one-dimensional rows/arrays (diode bars) or two dimensional arrays (diode-bar stacks). A diode array stack is generally a vertical stack of diode bars. Laser diode bars or arrays generally achieve substantially higher power, and cost effectiveness than an equivalent single broad area diode. High-power diode bars generally contain an array of broad-area emitters, generating tens of watts with relatively poor beam quality; despite the higher power, the brightness is often lower than that of a broad area laser diode. High-power diode bars may be stacked to produce high-power stacked diode bars for generation of extremely high powers of hundreds or thousands of watts. Laser diode arrays may be configured to emit a beam into free space or into a fiber. Fiber-coupled diode-laser arrays may be conveniently used as a pumping source for fiber lasers and fiber amplifiers.

A diode-laser bar is a type of semiconductor laser containing a one-dimensional array of broad-area emitters or alternatively containing sub arrays containing, e.g., 10-20 narrow stripe emitters. A broad-area diode bar typically contains, for example, 19-49 emitters, each having dimensions on the order of, e.g., 1 $\mu m \times 100$ $\mu m$. The beam quality along the 1 $\mu m$ dimension or fast-axis is typically diffraction-limited. The beam quality along the 100 $\mu m$ dimension or slow-axis or array dimension is typically many times diffraction-limited. Typically, a diode bar for commercial applications has a laser resonator length of the order of 1 to 4 mm, is about 10 mm wide and generates tens of watts of output power. Most diode bars operate in the wavelength region from 780 to 1070 nm, with the wavelengths of 808 nm (for pumping neodymium lasers) and 940 nm (for pumping Yb:YAG) being most prominent. The wavelength range of 915-976 nm is used for pumping erbium-doped or ytterbium-doped high-power fiber lasers and amplifiers.

A diode stack is simply an arrangement of multiple diode bars that can deliver very high output power. Also called diode laser stack, multi-bar module, or two-dimensional laser array, the most common diode stack arrangement is that of a vertical stack which is effectively a two-dimensional array of edge emitters. Such a stack may be fabricated by attaching diode bars to thin heat sinks and stacking these assemblies so as to obtain a periodic array of diode bars and heat sinks. There are also horizontal diode stacks, and two-dimensional stacks. For the high beam quality, the diode bars generally should be as close to each other as possible. On the other hand, efficient cooling requires some minimum thickness of the heat sinks mounted between the bars. This tradeoff of diode bar spacing results in beam quality of a diode stack in the vertical direction (and subsequently its brightness) is much lower than that of a single diode bar. There are, however, several techniques for significantly mitigating this problem, e.g., by spatial interleaving of the outputs of different diode stacks, by polarization coupling, or by wavelength multiplexing. Various types of high-power beam shapers and related devices have been developed for such purposes. Diode stacks may provide extremely high output powers (e.g. hundreds or thousands of watts).

Output beams produced in accordance with embodiments of the present invention may be utilized to process a workpiece such that the surface of the workpiece is physically altered and/or such that a feature is formed on or within the surface, in contrast with optical techniques that merely probe a surface with light (e.g., reflectivity measurements). Exemplary processes in accordance with embodiments of the invention include cutting, welding, drilling, and soldering. Various embodiments of the invention may also process workpieces at one or more spots or along a one-dimensional linear or curvilinear processing path, rather than flooding all or substantially all of the workpiece surface with radiation from the laser beam. Such one-dimensional paths may be composed of multiple segments, each of which may be linear or curvilinear.

In an aspect, embodiments of the invention feature an alignment system for use with a laser resonator that spatially overlaps multiple input beams along a wavelength-beam-combining (WBC) dimension and outputs a resulting output beam from a beam output. The alignment system includes, consists essentially of, or consists of a dispersive element, a beam profiler, a first lens, and a second lens. The dispersive element receives the output beam and disperses the output beam to generate a plurality of dispersed beams in the WBC dimension. The beam profiler receives the plurality of dispersed beams and generates images of relative positions of the dispersed beams received by the beam profiler. The first lens has optical power in a non-WBC dimension perpendicular to the WBC dimension. The first lens is disposed optically downstream of the beam output and optically upstream of the beam profiler. The second lens focuses the dispersed beams on or toward the beam profiler. The second lens has optical power in the WBC dimension. The second lens is disposed optically downstream of the beam output (e.g., optically downstream of the dispersive element) and optically upstream of the beam profiler.

Embodiments of the invention may include one or more of the following in any of a variety of combinations. The dispersive element may include, consist essentially of, or consist of a diffraction grating. The first lens may be disposed optically upstream of the dispersive element. The first lens may only have optical power in the non-WBC dimension. A focal length of the first lens may be larger than a focal length of the second lens. The first lens and/or the second lens may include, consist essentially of, or consist of one or more cylindrical lenses. The optical distance between the first lens and the beam profiler may be approximately equal to a focal length of the first lens. The optical distance between the first lens and the beam profiler may be greater than a focal length of the first lens. The optical distance between the first lens and the beam output may be approximately equal to a focal length of the first lens. The optical distance between the second lens and the beam profiler may be approximately equal to a focal length of the second lens.

The optical distance between the second lens and the dispersive element may be approximately equal to a focal length of the second lens. The second lens may only have optical power in the WBC dimension.

The first lens may be movable between (i) a first position within a path of the output beam to thereby generate a far-field image via the beam profiler, and (ii) a second position outside the path of the output beam, whereby a near-field image is generated via the beam profiler. The alignment system may include a third lens. A focal length of the third lens may be less than a focal length of the first lens. The first lens and the third lens may be interchangeable within a path of the output beam such that (i) when the first lens is within the path of the output beam a far-field image is generated via the beam profiler and (ii) when the third lens is within the path of the output beam a near-field image is generated via the beam profiler.

The alignment system may include a third lens disposed optically downstream of the beam output and optically upstream of the first lens. The third lens may have optical power in the non-WBC dimension. The third lens may only have optical power in the non-WBC dimension. A focal length of the third lens may be less than a focal length of the first lens. The optical distance between the third lens and the beam output may be approximately equal to a focal length of the third lens. The optical distance between the third lens and the beam profiler may be greater than a focal length of the third lens. The third lens may be movable between (i) a first position within a path of the output beam to thereby generate a near-field image via the beam profiler, and (ii) a second position outside the path of the output beam, whereby a far-field image is generated via the beam profiler.

The alignment system may include a beam rotator disposed optically downstream of the beam output. The beam rotator may be configured to rotate the output beam by approximately 90°. The beam rotator may include, consist essentially of, or consist of (i) two confocal cylindrical lenses, (ii) a dove prism, or (iii) two reflectors. The beam output may include, consist essentially of, or consist of a partially reflective output coupler.

In another aspect, embodiments of the invention feature an alignable laser system that includes, consists essentially of, or consists of a laser resonator and an alignment system. The laser resonator includes, consists essentially of, or consists of (i) a plurality of beam emitters for emitting a plurality of input beams, (ii) a plurality of optical elements for manipulating the input beams, and (iii) a beam output. The laser resonator is configured to spatially overlap the input beams along a wavelength-beam-combining (WBC) dimension and output a resulting output beam from the beam output. The alignment system includes, consists essentially of, or consists of a beam profiler for generating images of the input beams emitted by the beam emitters.

Embodiments of the invention may include one or more of the following in any of a variety of combinations. The laser system may include a controller configured to adjust the optical elements to align the input beams based at least on images generated by the beam profiler. The optical elements may include, consist essentially of, or consist of one or more interleaver mirrors and/or one or more collimation lenses. The controller may be configured to adjust the optical elements by tilting one or more said interleaver mirrors and/or translating one or more said collimation lenses. At least one of, or even each of, the collimation lenses may be a slow-axis collimation lens. At least one of, or even each of, the collimation lenses may be a fast-axis collimation lens. The laser resonator may include, consist essentially of, or consist of (a) a dispersive element for receiving and wavelength-dispersing the input beams, thereby forming a multi-wavelength beam, and (b) a partially reflective output coupler for (i) transmitting a first portion of the multi-wavelength beam as the output beam and (ii) reflecting a second portion of the multi-wavelength beam back to the dispersive element (and thence to beam emitters to form external laser cavities and stabilize the beam emitters to their emission wavelengths, each of which may be different). The laser resonator may include, associated with each of the beam emitters, a fast-axis collimator and an optical rotator for inducing beam rotation of approximately 90°. The dispersive element may include, consist essentially of, or consist of a diffraction grating. The laser resonator may include (a) a plurality of first collimators, each first collimator receiving and collimating one or more beams from one of the beam emitters, (b) a plurality of interleavers, each interleaver receiving the one or more beams from one of the first collimators, and (c) a second collimator for receiving all of the beams from the plurality of interleavers, collimating the beams, and transmitting the beams to the dispersive element. At least one, or even each first collimator may include, consist essentially of, or consist of a slow-axis collimation lens. At least one, or even each first collimator may include, consist essentially of, or consist of a fast-axis collimation lens. The laser resonator may include a folding mirror disposed optically downstream of the dispersive element and optically upstream of the partially reflective output coupler. The partially reflective output coupler may be the beam output. The beam profiler may be disposed optically downstream of the beam output.

The alignment system may further include, consist essentially of, or consist of a dispersive element, a first lens, and a second lens. The dispersive element may receive the output beam and disperse the output beam to generate a plurality of dispersed beams in the WBC dimension. The first lens may have optical power in a non-WBC dimension perpendicular to the WBC dimension. The first lens may be disposed optically downstream of the beam output and optically upstream of the beam profiler. The second lens may have optical power in the WBC dimension. The second lens may focus the dispersed beams on or toward the beam profiler. The second lens may be disposed optically downstream of the beam output (e.g., optically downstream of the dispersive element) and optically upstream of the beam profiler. The beam profiler may be configured to receive the plurality of dispersed beams and generate images of the relative positions of the dispersed beams received by the beam profiler. The first lens may be movable between (i) a first position within a path of the output beam to thereby generate a far-field image via the beam profiler, and (ii) a second position outside the path of the output beam, whereby a near-field image is generated via the beam profiler. The alignment system may include a third lens. A focal length of the third lens may be less than a focal length of the first lens. The first lens and the third lens may be interchangeable within a path of the output beam such that (i) when the first lens is within the path of the output beam a far-field image is generated via the beam profiler and (ii) when the third lens is within the path of the output beam a near-field image is generated via the beam profiler.

The alignment system may include a third lens disposed optically downstream of the beam output and optically upstream of the first lens. A focal length of the third lens may be less than a focal length of the first lens. The third lens may be movable between (i) a first position within a path of the output beam to thereby generate a near-field image via the beam profiler, and (ii) a second position outside the path of the output beam, whereby a far-field image is generated via the beam profiler. The alignment system may include a beam rotator disposed optically downstream of the beam output. The beam rotator may be configured to rotate the output beam by approximately 90°. The beam rotator may include, consist essentially of, or consist of (i) two confocal cylindrical lenses, (ii) a dove prism, or (iii) two reflectors.

In yet another aspect, embodiments of the invention feature an alignment system for use with a laser resonator that spatially overlaps multiple input beams along a wavelength-beam-combining (WBC) dimension and outputs a resulting output beam from a beam output. The alignment system includes, consists essentially of, or consists of a dispersive element, a beam profiler, a first lens, a second lens, a third lens, and a plurality of optical elements. The dispersive element is configured to disperse beams in the WBC dimension. The beam profiler receives beams and generates images of relative positions thereof. The first lens has optical power in a non-WBC dimension perpendicular to the WBC dimension. The first lens is disposed optically downstream of the beam output and optically upstream of the beam profiler. The second lens has optical power in the WBC dimension. The second lens focuses dispersed beams on or toward the beam profiler. The second lens is disposed optically downstream of the beam output (e.g., optically downstream of the dispersive element) and optically upstream of the beam profiler. The third lens has optical power in the non-WBC dimension. The third lens is disposed optically downstream of the beam output and optically upstream of the beam profiler. The optical elements are configured to (i) receive the output beam, (ii) direct a first portion of the output beam to the third lens, and (iii) direct a second portion of the output beam to the first lens.

Embodiments of the invention may include one or more of the following in any of a variety of combinations. The second portion of the output beam may not be directed to the third lens. The first lens may be positioned to receive both the first portion of the output beam and the second portion of the output beam. The optical elements may be configured to direct the first and second portions of the output beam to the first lens at different angles. The dispersive element may be positioned to receive and disperse the first portion of the output beam, whereby a near-field image of the input beams is generated via the beam profiler. The dispersive element may be positioned to receive and disperse the second portion of the output beam, whereby a far-field image of the input beams is generated via the beam profiler. The dispersive element may include, consist essentially of, or consist of a diffraction grating.

The first lens may be disposed optically upstream of the dispersive element. The third lens may be disposed optically upstream of the first lens. A focal length of the first lens may be larger than a focal length of the second lens. The first lens, the second lens, and/or the third lens may include, consist essentially of, or consist of one or more cylindrical lenses. The optical distance between the first lens and the beam profiler may be approximately equal to a focal length of the first lens. The optical distance between the first lens and the beam output may be approximately equal to a focal length of the first lens. The optical distance between the second lens and the beam profiler may be approximately equal to a focal length of the second lens. The optical distance between the second lens and the dispersive element may be approximately equal to a focal length of the second lens. A focal length of the third lens may be less than a focal length of the first lens. The optical distance between the third lens and the beam output may be approximately equal to a focal length of the third lens. The optical distance between the third lens and the beam profiler may be greater than a focal length of the third lens.

The alignment system may include a beam rotator disposed optically downstream of the beam output. The beam rotator may be configured to rotate the output beam by approximately 90°. The beam rotator may include, consist essentially of, or consist of (i) two confocal cylindrical lenses, (ii) a dove prism, or (iii) two reflectors. The first lens may only have optical power in the non-WBC dimension. The second lens may only have optical power in the WBC dimension. The third lens may only have optical power in the non-WBC dimension. At least one of, or even each of, the optical elements may include, consist essentially of, or consist of a beam splitter and/or a reflector. The beam output may include, consist essentially of, or consist of a partially reflective output coupler.

In another aspect, embodiments of the invention feature an alignable laser system that includes, consists essentially of, or consists of a laser resonator and an alignment system. The laser resonator includes, consists essentially of, or consists of (i) a plurality of beam emitters for emitting a plurality of input beams, (ii) a beam output, and (iii) disposed optically upstream of the beam output, a plurality of first optical elements for manipulating the input beams. The laser resonator is configured to spatially overlap the input beams along a wavelength-beam-combining (WBC) dimension and output a resulting output beam from the beam output. The alignment system includes, consists essentially of, or consists of a plurality of second optical elements disposed optically downstream of the beam output. The alignment system is configured to simultaneously generate near-field and far-field images of the input beams without physical movement of the plurality of second optical elements.

Embodiments of the invention may include one or more of the following in any of a variety of combinations. The alignment system may include a beam profiler for generating the near-field and far-field images (e.g., of the input beams of the laser resonator). The beam profiler may be disposed optically downstream of the beam output. The laser system may include a controller configured to adjust the first optical elements to align the input beams based at least in part on the near-field and/or far-field images. One or more of, or even each of, the first optical elements may include, consist essentially of, or consist of one or more interleaver mirrors and/or one or more collimation lenses. The controller may be configured to adjust the first optical elements by tilting one or more said interleaver mirrors and/or translating one or more said collimation lenses. At least one of, or even each of, the collimation lenses may be a slow-axis collimation lens. At least one of, or even each of, the collimation lenses may be a fast-axis collimation lens. The laser resonator may include (a) a dispersive element for receiving and wavelength-dispersing the input beams, thereby forming a multi-wavelength beam and (b) a partially reflective output coupler for (i) transmitting a first portion of the multi-wavelength beam as the output beam and (ii) reflecting a second portion of the multi-wavelength beam back to the dispersive element. The laser resonator may include, associated with each of the beam emitters, a fast-axis collimator and an optical rotator for inducing beam rotation of approximately 90°. The dispersive element may include, consist essentially of, or consist of a diffraction grating. The laser resonator may include (a) a plurality of first collimators, each first collimator receiving and collimating one or more beams from one of the beam emitters, (b) a plurality of interleavers, each interleaver receiving the one or more beams from one of the first collimators, and (c) a second collimator for receiving all of the beams from the plurality of interleavers, collimating the beams, and transmitting the beams to the dispersive element. At least one, or even each, first collimator may include, consist essentially of, or consist of a slow-axis collimation lens. At least one, or even each, first collimator may include, consist essentially of, or consist of a fast-axis collimation lens. The laser resonator may include a folding mirror disposed optically downstream of the dispersive element and optically upstream of the partially reflective output coupler. The partially reflective output coupler may be the beam output.

The alignment system may include (i) a dispersive element configured to disperse beams in the WBC dimension, and (ii) a beam profiler for receiving beams and generating images of relative positions thereof. The plurality of second optical elements may include, consist essentially of, or consist of a first lens, a second lens, a third lens, and a plurality of third optical elements. The first lens may have optical power in a non-WBC dimension perpendicular to the WBC dimension. The first lens may be disposed optically downstream of the beam output and optically upstream of the beam profiler. The second lens may have optical power in the WBC dimension. The second lens may focus dispersed beams on or toward the beam profiler. The second lens may be disposed optically downstream of the beam output (e.g., optically downstream of the dispersive element) and optically upstream of the beam profiler. The third lens may have optical power in the non-WBC dimension. The third lens may be disposed optically downstream of the beam output and optically upstream of the beam profiler. The third optical elements may be configured to (i) receive the output beam, (ii) direct a first portion of the output beam to the third lens, and (iii) direct a second portion of the output beam to the first lens.

The second portion of the output beam may not be directed to the third lens. The first lens may be positioned to receive both the first portion of the output beam and the second portion of the output beam. The third optical elements may be configured to direct the first and second portions of the output beam to the first lens at different angles. The dispersive element may be positioned to receive and disperse the first portion of the output beam, whereby the near-field image of the input beams is generated via the beam profiler. The dispersive element may be positioned to receive and disperse the second portion of the output beam, whereby the far-field image of the input beams is generated via the beam profiler. At least one of, or even each of, the third optical elements may include, consist essentially of, or consist of a beam splitter and/or a reflector. The dispersive element may include, consist essentially of, or consist of a diffraction grating. The alignment system may include a beam rotator disposed optically downstream of the beam output. The beam rotator may be configured to rotate the output beam by approximately 90°. The beam rotator may include, consist essentially of, or consist of (i) two confocal cylindrical lenses, (ii) a dove prism, or (iii) two reflectors.

In yet another aspect, embodiments of the invention feature a method of alignment for use with a laser resonator that spatially overlaps multiple input beams along a wavelength-beam-combining (WBC) dimension and outputs a resulting output beam from a beam output. The laser resonator includes a plurality of optical elements for manipulating the input beams. The method includes, consists essentially of, or consists of (a) generating, with a beam profiler, at least one of (i) a near-field image of the input beams or (ii) a far-field image of the input beams, and (b) when one of the input beams is misaligned in at least one of the near-field image or the far-field image, adjusting one or more of the optical elements to align the input beam.

Embodiments of the invention may include one or more of the following in any of a variety of combinations. Both the near-field image and the far-field image may be generated. The near-field image and the far-field image may be generated sequentially or simultaneously. The method may include, before generating the at least one of the near-field image or the far-field image, (i) wavelength-dispersing the output beam to generate a plurality of dispersed beams in the WBC dimension, and (ii) focusing the dispersed beams toward the beam profiler. The optical elements may include, consist essentially of, or consist of one or more interleaver mirrors and/or one or more collimation lenses. Adjusting one or more of the optical elements may include, consist essentially of, or consist of tilting one or more said interleaver mirrors and/or translating one or more said collimation lenses. At least one of, or even each of, the collimation lenses may be a slow-axis collimation lens. At least one of, or even each of, the collimation lenses may be a fast-axis collimation lens. Generating the far-field image may include, consist essentially of, or consist of positioning a first lens within a path of the output beam. Generating the near-field image may include, consist essentially of, or consist of removing the first lens from the path of the output beam. Generating the far-field image may include, consist essentially of, or consist of positioning a first lens within a path of the output beam. Generating the near-field image may include, consist essentially of, or consist of replacing the first lens with a second lens having a focal length less than a focal length of the first lens. Generating the near-field image may include, consist essentially of, or consist of positioning first and second lenses within a path of the output beam. Generating the far-field image may include, consist essentially of, or consist of removing the second lens from the path of the output beam. The second lens may have a focal length less than a focal length of the first lens. Generating the far-field image may include, consist essentially of, or consist of directing a first portion of the output beam to a first lens. Generating the near-field image may include, consist essentially of, or consist of directing a second portion of the output beam to a second lens. The method may include rotating the output beam before generating the at least one of the near-field image or the far-field image.

The laser resonator may include (a) a dispersive element for receiving and wavelength-dispersing the input beams, thereby forming a multi-wavelength beam and (b) a partially reflective output coupler for (i) transmitting a first portion of the multi-wavelength beam as the output beam and (ii) reflecting a second portion of the multi-wavelength beam back to the dispersive element. The laser resonator may include a plurality of beam emitters configured to emit the input beams. The laser resonator may include, associated with each of the beam emitters, a fast-axis collimator and an optical rotator for inducing beam rotation of approximately 90°. The dispersive element may include, consist essentially of, or consist of a diffraction grating. The plurality of optical elements may include, consist essentially of, or consist of (a) a plurality of first collimators, each first collimator receiving and collimating one or more input beams, (b) a plurality of interleavers, each interleaver receiving the one or more input beams from one of the first collimators, and (c) a second collimator for receiving all of the input beams from the plurality of interleavers, collimating the beams, and transmitting the beams to the dispersive element. At least one, or even each, first collimator may include, consist essentially of, or consist of a slow-axis collimation lens. At least one, or even each, first collimator may include, consist essentially of, or consist of a fast-axis collimation lens. The laser resonator may include a folding mirror disposed optically downstream of the dispersive element and optically upstream of the partially reflective output coupler. The partially reflective output coupler may be the beam output. The beam profiler may be disposed optically downstream of the beam output.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the term "substantially" means±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated. Herein, "downstream" or "optically downstream," is utilized to indicate the relative placement of a second element that a light beam strikes after encountering a first element, the first element being "upstream," or "optically upstream" of the second element. Herein, "optical distance" between two components is the distance between two components that is actually traveled by light beams; the optical distance may be, but is not necessarily, equal to the physical distance between two components due to, e.g., reflections from mirrors or other changes in propagation direction experienced by the light traveling from one of the components to the other. Distances utilized herein may be considered to be "optical distances" unless otherwise specified.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
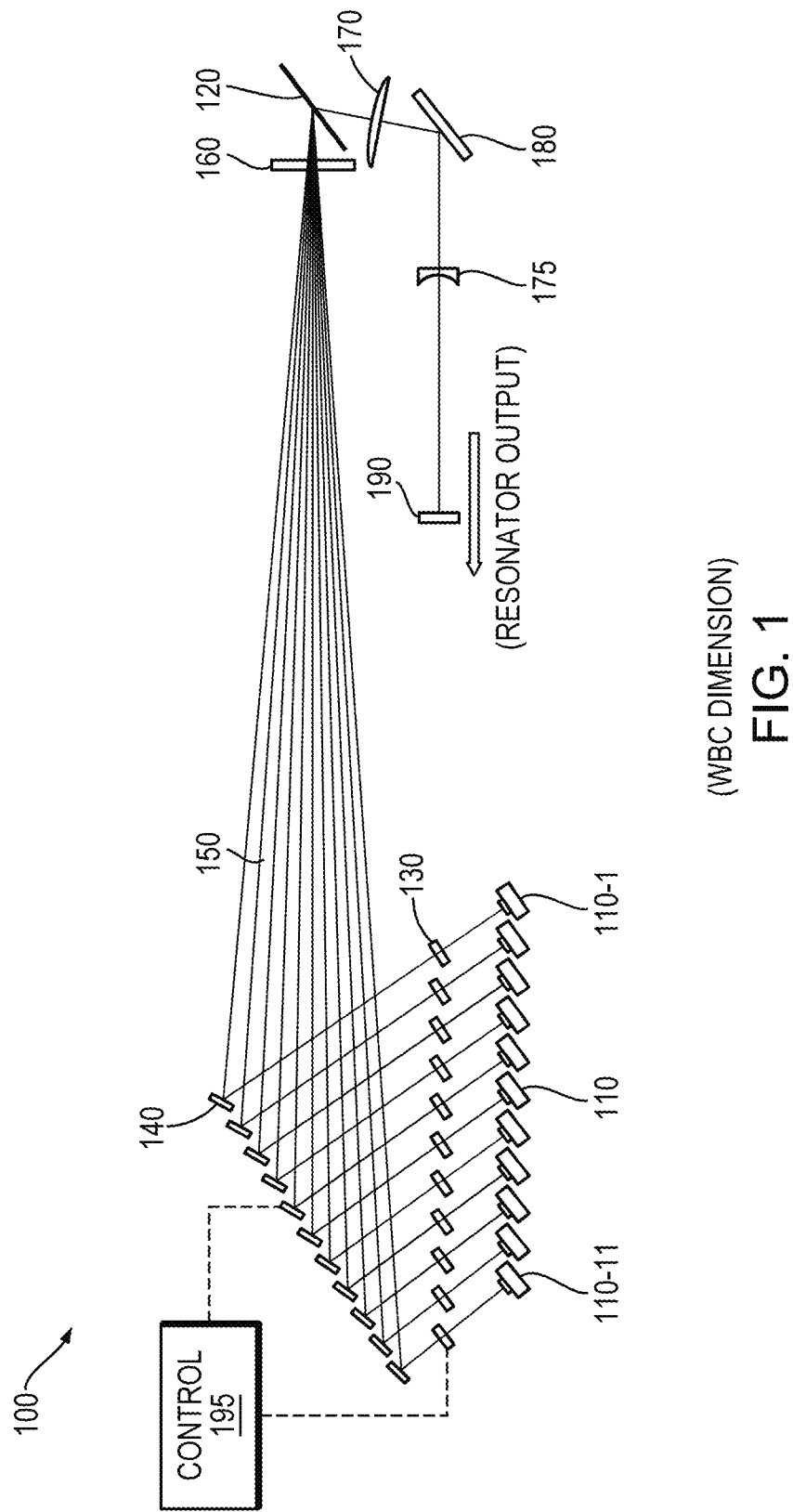
FIG. 1 is a schematic diagram of a wavelength beam combining (WBC) resonator, in the WBC dimension, in accordance with embodiments of the invention.

FIG. 1 schematically depicts various components of a WBC resonator 100 which, in the depicted embodiment, combines the beams emitted by eleven different diode bars (as utilized herein, "diode bar" refers to any multi-beam emitter, i.e., an emitter from which multiple beams are emitted from a single package). Embodiments of the invention may be utilized with fewer or more than eleven emitters. In accordance with embodiments of the invention, each emitter may emit a single beam, or, each of the emitters may emit multiple beams. The view of FIG. 1 is along the WBC dimension, i.e., the dimension in which the beams from the bars are combined. The resonator 100 features eleven diode bars 110 (110-1-110-11), and each diode bar 110 includes, consists essentially of, or consists of an array (e.g., one-dimensional array) of emitters along the WBC dimension. Each emitter of a diode bar 110 emits a non-symmetrical beam having a larger divergence in one direction (known as the "fast axis," here oriented vertically relative to the WBC dimension) and a smaller divergence in the perpendicular direction (known as the "slow axis," here along the WBC dimension).

In various embodiments, each of the diode bars 110 is associated with (e.g., attached or otherwise optically coupled to) a fast-axis collimator (FAC)/optical twister microlens assembly that collimates the fast axis of the emitted beams while rotating the fast and slow axes of the beams by 90°, such that the slow axis of each emitted beam is perpendicular to the WBC dimension downstream of the microlens assembly. The microlens assembly also converges the chief rays of the emitters from each diode bar 110 toward the dispersive element 120. Suitable microlens assemblies are described in U.S. Pat. No. 8,553,327, filed on Mar. 7, 2011, and U.S. Pat. No. 9,746,679, filed on Jun. 8, 2015, the entire disclosure of each of which is hereby incorporated by reference herein.

Embodiments of the invention presented herein associate both a FAC lens and an optical twister (e.g., as a microlens assembly) with each of the emitted beams, and thus SAC lenses (as detailed below) affect the beams in the non-WBC dimension. In other embodiments, the emitted beams are not rotated, and FAC lenses may be utilized to alter pointing angles in the non-WBC dimension. Thus, it is understood that references to SAC lenses herein generally refer to lenses having power in the non-WBC dimension, and such lenses may be or include FAC lenses in various embodiments.

As shown in FIG. 1, resonator 100 also features a set of SAC lenses 130, one SAC lens 130 associated with, and receiving beams from, one of the diode bars 110. Each of the SAC lenses 130 collimates the slow axes of the beams (i.e., in the non-WBC dimension) emitted from a single diode bar 110. After collimation in the slow axis by the SAC lenses 130, the beams propagate to a set of interleaving mirrors 140, which redirect the beams 150 toward the dispersive element 120. (In FIG. 1, the beams 150 are the center chief rays representing the eleven assembled beams from the eleven diode bars 110.) In various embodiments, the arrangement of the interleaving mirrors 140 enables the free space between the diode bars 110 to be minimized. The dispersive element 120 multiplexes the individual spatially separated beams into a single beam having multiple wavelengths (i.e., the wavelengths of the individual beams). Upstream of the dispersive element 120 (which may include, consist essentially of, or consist of, for example, a diffraction grating such as the transmissive diffraction grating depicted in FIG. 1, or a reflective diffraction grating), a lens 160 collimates the individual beams (e.g., sub-beams, rather than the chief rays) from the diode bars 110. In various embodiments, the lens 160 is disposed at an optical distance away from the diode bars 110 that is substantially equal to the focal length of the lens 160. Note that the overlap of the chief rays at the dispersive element 120 is primarily due to the redirection of the interleaving mirrors 140, rather than the focusing power of the lens 160.

Also depicted in FIG. 1 are lenses 170, 175, which form an optical telescope for mitigation of optical cross-talk, as disclosed in U.S. Pat. No. 9,256,073, filed on Mar. 15, 2013, and U.S. Pat. No. 9,268,142, filed on Jun. 23, 2015, the entire disclosure of each of which is hereby incorporated by reference herein. Resonator 100 may also include one or more optional folding mirrors 180 for redirection of the beams such that the resonator 100 may fit within a smaller physical footprint. The dispersive element 120 combines the beams from the diode bars 110 into a single, multi-wavelength beam, which propagates to a partially reflective output coupler 190. The coupler 190 transmits a portion of the beam as the output beam of resonator 100 while reflecting another portion of the beam back to the dispersive element 120 and thence to the diode bars 110 as feedback to stabilize the emission wavelengths of each of the beams (which are typically different from each other).

As shown in FIG. 1, each diode bar 110 has a corresponding SAC 130 and a corresponding interleaver mirror 140, and all the optics optically downstream of the interleaver mirrors 140 are shared by all the diode bars 110.

Generally, WBC resonators are desirably aligned on both WBC and non-WBC dimensions. That is, beams from different diodes (i.e., the individual emitters in the diode bars) are desirably adjusted to be overlapped at the dispersive element 120 (e.g., approximately at the center thereof) in both WBC and non-WBC dimensions and approximately normal to the output coupler 190 for stable lasing.

Individual emitters may emit at free-running (i.e., unlocked) wavelengths if the resonator is misaligned, particularly if it is misaligned in the non-WBC dimension or severely misaligned in the WBC dimension. For example, an emitter may be severely misaligned in the WBC dimension if the misalignment thereof shifts the emission to a non-lasing region (i.e., out of the emitter effective gain bandwidth), or if the emitter output is severely clipped, e.g., >20% clipping in power and/or beam size, for example, at the optics due to off-centering at one or more optics. Assuming, as an example, the resonator dispersive element is aligned at the Littrow angle (i.e., where the diffraction angle is equal to the angle of incidence), for an emitter wavelength of 975 nm, with line density of 1.64/μm, and disregarding power clipping, a 20 mrad misalignment relative to the orientation of the dispersive element in the WBC dimension will cause a wavelength shift of about 8 nm, which may be sufficiently large to move the "lasing wavelength" out of the diode emitter bandwidth (typically ranging from 14 nm to 20 nm), particularly when considering the typically over 10 nm intrinsic shift of the gain curve of a diode emitter associated with emitter temperature change from room temperature (or coolant temperature) to a typical operating temperature (e.g., ranging from approximately 60° C. to approximately 70° C., or even higher).

Typically, once aligned in the non-WBC dimension, emitters will be locked in at resonator wavelengths satisfying the grating diffraction equation, i.e., $\sin(A_i)+\sin(B)=p\lambda_i$, where $A_i$ is the incident angle on the dispersive element 120 of the i-th emitter, $\lambda_i$ is the lasing wavelength of the i-th emitter, and B and p are the diffraction angle and the grating line density, respectively.

Since emitters are typically locked at wavelengths having diffraction angles normal to the output coupler 190 in the WBC dimension, any alignment change in the WBC dimension will result in a wavelength shift, but will generally not cause other serious issues such as significant power drop, as long as the shifted wavelengths remain within the working bands of individual emitters. (For example, a diode emitter emitting at the 975 nm region typically has a gain bandwidth (full width at 90%) ranging from 14 nm to 20 nm. The working band of an emitter is equal to its gain bandwidth if not considering temperature change. However, the working band may be reduced to less than a few nm if the resonator is required to have a quick cold start.) In contrast, misalignments in the non-WBC dimension may have more severe consequences.

Figure 2:
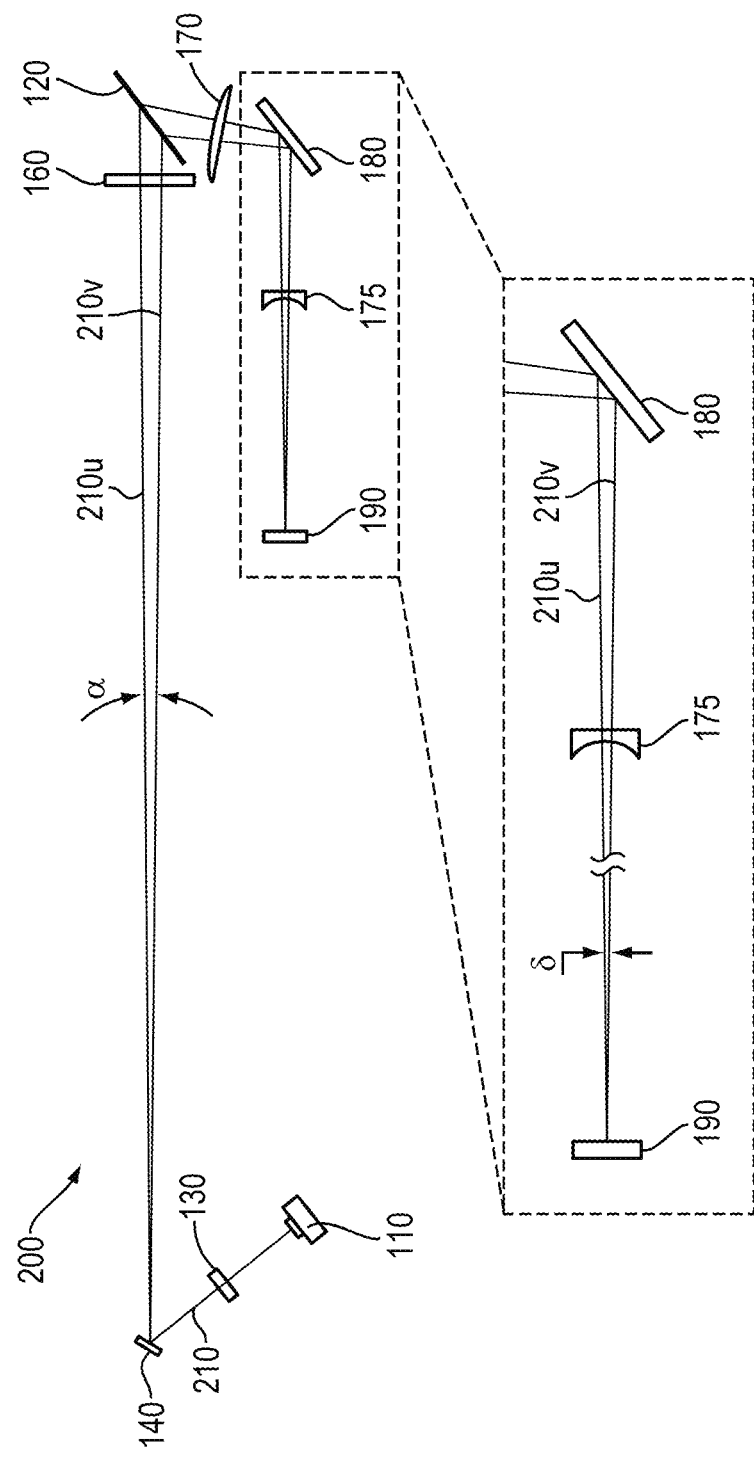
FIG. 2 is a schematic diagram of portions of a WBC resonator, in the WBC dimension, in accordance with embodiments of the invention.

FIG. 2 illustrates a consequence of misalignment of a WBC resonator 200 in the WBC dimension. For illustrative purposes and for clarity, resonator 200 is depicted with only a single diode bar 110, but it is understood that the illustrated principle may apply to resonators having multiple diode bars 110. In addition, only the beam from a single emitter (the i-th emitter) is shown for clarity. In a state of alignment, the emitter is locked at wavelength M, and its chief ray 210 propagates along a direction 210$u$, which passes through the centers of each of the optical elements and is normal to the coupler 190 in both WBC and non-WBC directions.

In an exemplary embodiment, misalignment in the WBC dimension is caused by a small angular change (e.g., rotation) of the interleaver 140 corresponding to the emitter, which causes the emitter chief ray 210 to propagate along a direction 210$v$. This direction 210$v$ diverges from the original direction 210$u$ by an angle α in the WBC dimension. In addition, the change in angle of incidence from $A_i$ to an approximate angle of $(A_i+\alpha)$ on the dispersive element 120 results in a wavelength shift from $\lambda_i$ to $(\lambda_i+\Delta\lambda)$, determined by the grating equation: $\sin(A_i+\alpha)+\sin(B)\approx p\times(\lambda_i+\Delta\lambda)$.

As illustrated in the magnified portion of FIG. 2, misalignment in the WBC dimension will also result in a decentering distance, δ, at the output coupler 190, which may degrade the beam quality in WBC dimension by a factor of 1+δ/S, where S is the beam size in the WBC dimension at the output coupler 190. Since lenses 170 and 175 are typically in a confocal arrangement (i.e., forming an optical telescope), the decentering distance δ may be estimated by $\delta \approx \alpha \times D/R \times \cos(B)/\cos(A_i)$, where D is the distance from the interleaver 140 to the dispersive element 120, and R is the ratio of focal lengths of lenses 170,175, which in various embodiments is within the range of approximately 3 to approximately 20. If the dispersive element 120 is configured at the Littrow angle, i.e., cos(B)/cos(Ai)≈1, then δ≈α×D/R.

In an exemplary embodiment, it may be assumed that D=1000 mm, R=10, $\lambda i$=0.975 μm, and the dispersive element 120 is oriented at the Littrow angle with line density p=1.6/μm. The resulting wavelength shift and the decentering distance due to misalignment of angle α may be estimated by Δλ(μm)≈0.4×α and δ(mm)≈100×α. If α=1 mrad, then Δλ≈0.4 nm and δ≈100 μm. In such an example, the misalignment in the WBC dimension may not substantially affect emitter lasing, and may not cause stability issues for the WBC resonator. A wavelength shift of approximately 0.4 nm is small compared to an over 15 nm gain width for a diode laser at the 1 μm emission regime. In addition, a decentering distance of 100 μm may be equivalent to about 5-10% of the beam size in the WBC dimension, which corresponds to a 5-10% beam quality degradation in the WBC dimension. The severity of such a degradation may depend on the particular resonator and application in which it is deployed.

Figure 3:
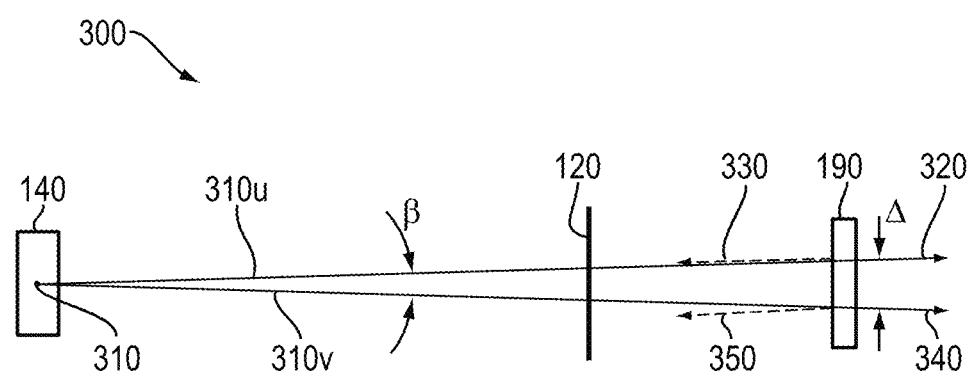
FIG. 3 is a schematic diagram of portions of a WBC resonator, in the non-WBC dimension, in accordance with embodiments of the invention.

FIG. 3 depicts portions of a resonator 300 that is similar to resonator 200 of FIG. 2 but in the non-WBC dimension, in order to illustrate an example misalignment in the non-WBC dimension. For simplicity, only the interleaver 140, the dispersive element 120, and the output coupler 190 are depicted. Lenses 150, 170, and 175 shown in FIG. 2 are assumed to lack optical power in the non-WBC dimension, although need not be the case in other embodiments of the present invention. A chief ray 310 of the i-th emitter (not shown) is perfectly aligned along direction 310$u$, which is normal to the coupler 190 and passes through the center of the coupler 190. The coupler is a partial reflector that splits the resonator beam into an output beam 320 and a feedback beam 330. The feedback beam 330 is normal to the coupler 190 and will therefore propagate back to the dispersive element 120 and thence to the corresponding emitter, thereby forming a stable resonator between the emitter and the coupler 190.

In an exemplary embodiment, misalignment in the non-WBC dimension results from a slight tilt of the interleaver mirror 140 in the non-WBC dimension, which causes the chief ray 310 to propagate along a misaligned direction 310$v$, which deviates from direction 310$u$ by an angle β In contrast with the WBC-dimension case depicted in FIG. 2, in the non-WBC dimension, the laser beam 310 from the example i-th emitter (either wavelength-locked or free-running) will propagate along the misaligned direction 310$v$ all the way to the coupler 190 as illustrated in FIG. 3. As shown, the example misalignment causes the misaligned output beam 340 to have relative large decentering distance (Δ) and a non-zero pointing error (β), resulting in less efficient resonator feedback since the feedback beam 350 is misaligned by 2β from the ideal normal direction along which feedback beam 330 propagates.

For illustrative purposes, it may be assumed that the emitter slow axis is in the non-WBC dimension and is collimated by a SAC lens (e.g., SAC lens 130 in FIGS. 1 and 2) having a 50 mm focal length, which results in a slow axis beam size at the coupler 190 of about 6 mm. Further assuming the maximum acceptable slow axis decentering distance is 0.6 mm (corresponding to 10% beam quality degradation) and an optical distance from the interleaver 140 to the coupler 190 of 1.5 m, then, from the viewpoint of beam decentering, the maximum acceptable misalignment angle β is calculated to be 0.4 mrad. However, from the viewpoint of resonator feedback, misalignment of 0.4 mrad will result in a 40 μm displacement of the feedback beam at the emitter surface in the slow axis; therefore, the feedback will be 40% less efficient (for an example emitter size of 100 μm). Displacement of the feedback beam relative to the corresponding emitter beam not only causes a decrease in power, but also may result in unstable wavelength locking (i.e., unstable resonator power) and a distorted beam shape at the output. Thus, generally speaking, WBC resonators are much more sensitive to misalignment in the non-WBC dimension than in the WBC dimension. In various embodiments, for a WBC resonator similar to that of FIG. 1, the misalignment in the slow axis (i.e., the non-WBC dimension) is desirably controlled to be less than or equal to approximately 0.1 mrad.

Figure 4A:
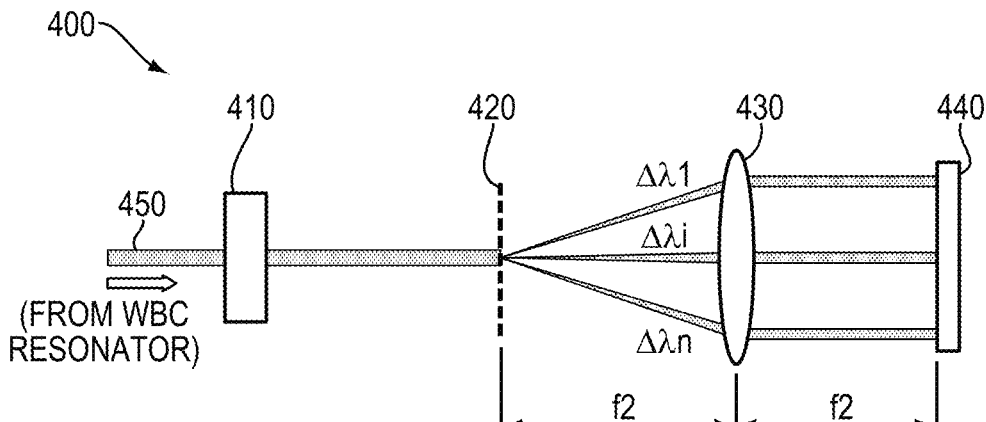
FIG. 4A is a schematic diagram of an alignment system, in the WBC dimension, in accordance with embodiments of the invention.
Figure 4B:
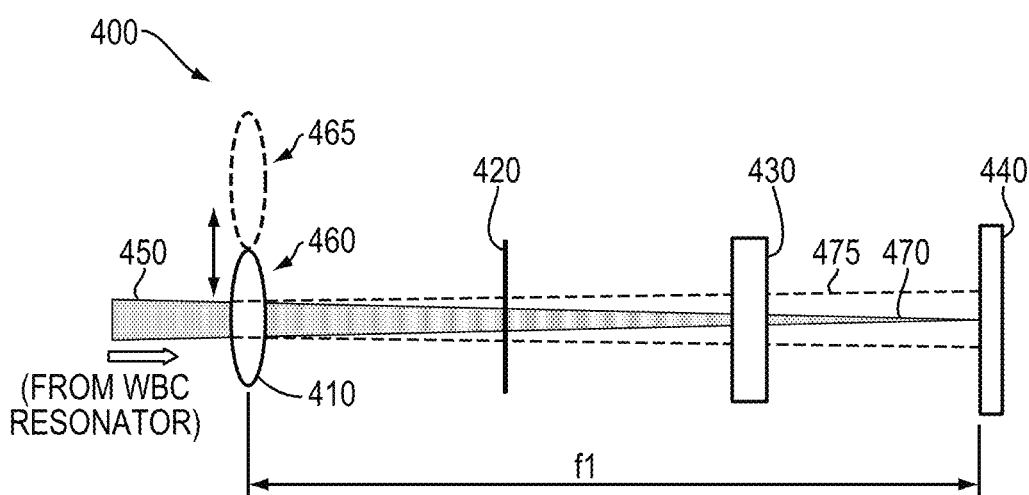
FIG. 4B is a schematic diagram of an alignment system, in the non-WBC dimension, in accordance with embodiments of the invention.

FIGS. 4A and 4B depict portions of an alignment system 400 in accordance with various embodiments of the invention. As shown, the alignment system 400 includes a first cylindrical lens 410, a dispersion element 420, a second cylindrical lens 430, and a beam profiler 440. FIGS. 4A and 4B depict the alignment system 400 in the WBC dimension and the non-WBC direction, respectively. The lens 410 has optical power in the non-WBC dimension and a focal length f1, and the lens 430 has optical power in the WBC dimension and a focal length f2. The dispersive element 420 may include, consist essentially of, or consist of, for example, a diffraction grating such as a transmissive diffraction grating or a reflective diffraction grating.

The beam profiler 440 may include, consist essentially of, or consist of, for example, a camera or other image sensor (e.g., a CCD sensor, CMOS sensor, or other photoresponsive sensor), and may include a display or be operatively coupled to a display. For example, beams incident of the beam profiler 440 may be displayed on the display in order to determine their alignment with each other. Beam profilers 440 are commercially available and may be provided and utilized without undue experimentation. For example, the beam profiler 440 may include, consist essentially of, or consist of, for example, one of the WinCamD series of beam profilers available from DataRay, Inc. of Redding, California. In various embodiments, the beam profiler 440 may be or include a physical screen (e.g., a near-infrared sensor plate for emitters emitting in the near-infrared regime, a white board or other plate for emitters emitting in the visible regime, or a UV-sensitive plate for emitters emitting in the UV regime), or a conventional camera or other collection of image sensors (e.g., two-dimensional sensors).

The alignment system 400 accepts a WBC resonator beam 450, which includes, consists essentially of, or consists of n sub-bands of wavelengths (Δλi, i=1:n). The beam 450 is dispersed by the dispersive element 420 in the WBC dimension, and the chief rays of the dispersed beams are collimated by lens 430. In general, the collimation of the chief rays of the dispersed beams produces well-defined overall image dimensions and beam separations at the beam profiler 440. In various embodiments, the lens 430 is located one focal length (i.e., of lens 430) downstream of the dispersive element 420. The lens 430 also focuses the individual beams on the beam profiler 440, which in various embodiments is located one focal length (i.e., of lens 430) downstream of the lens 430. In various embodiments, the resonator beam 450 is the output beam produced by WBC resonator 100 or a similar resonator.

While in the embodiments of alignment system 400 depicted in FIGS. 4A and 4B the lens 430 is located optically downstream of the dispersive element 420, in other embodiments the lens 430 may be located optically upstream of the dispersive element 420. In such embodiments, the lens 430 will still focus the individual beams on the beam profiler 440 but will typically not collimate the chief rays of the beams. In addition, such embodiments may not be preferred from the point of view of aberration, as the dispersive element 420 may induce more aberration to highly focused or diverged beams.

In the non-WBC dimension, as shown in FIG. 4B, the lens 410 may be located one focal length (i.e., of lens 410) upstream of the beam profiler 440. In various embodiments, the focal length f1 of lens 410 is longer than the focal length f2 of lens 430, and the lens 410 is disposed at a position upstream of the dispersive element 420.

As shown in FIG. 4B, the lens 410 may be disposed either at a position 460 in the path of the resonator beam 450 (e.g., so that the beam is centered approximately on the lens 410) or in a position 465 outside of the beam path. This results in a far-field image 470 or a near-field image 475 on the beam profiler 440, respectively. Assuming that the center line of the beam profiler 440 in the WBC dimension corresponds to the case of zero decentering distance and zero pointing error at the output coupler (e.g., coupler 190 in FIG. 1) in the non-WBC dimension for all the sub-beams in the output beam 450, then the amount of decentering distance of a sub-beam at far-field 470 or at near-field 475 may proportionally indicate the amount of pointing error or decentering distance of the corresponding sub-beam at the resonator output in the non-WBC dimension. In this manner, the alignment system 400 shown in FIGS. 4A and 4B may be an effective tool to optimize alignment of multi-wavelength resonators, such as WBC resonators.

Figure 5A:
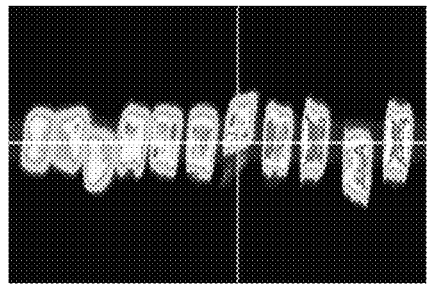
FIGS. 5A and 5B are, respectively, exemplary far-field and near-field images depicting beams misaligned in the non-WBC dimension.
Figure 5C:
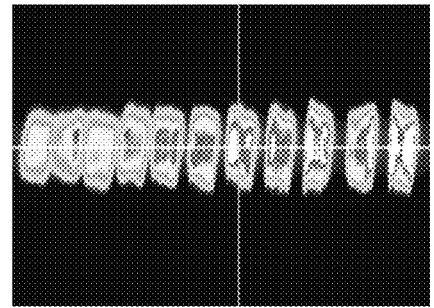
FIGS. 5C and 5D are, respectively, exemplary far-field and near-field images depicting beams aligned in the non-WBC dimension.
Figure 5B:
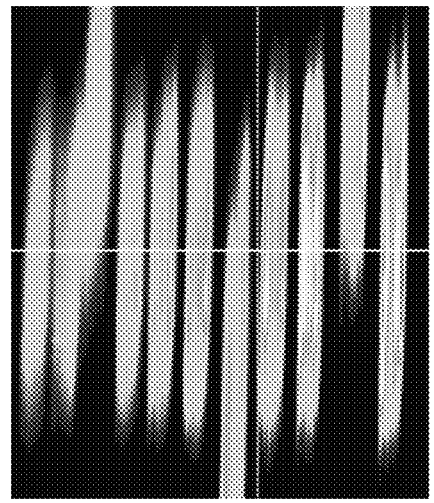

FIGS. 5A and 5B depict example far-field and near-field images with a few sub-beams (beams #3, #7, and #10 from the left side of the images) misaligned in the non-WBC dimension in a WBC resonator similar to resonator 100 depicted in FIG. 1. Each image includes 11 sub-beam images corresponding to 11 diode bars (e.g., diode bars 110 in FIG. 1) or 11 sub-bands of wavelengths ($\Delta\lambda i$, i=1:11) as shown in FIGS. 4A and 4B. Each sub-band may include, consist essentially of, or consist of multiple different wavelengths because each diode bar may include, consist essentially of, or consist of an array of emitters. The spectral gaps (or "dead spaces") between adjacent diode bars allow sub-beam images to be separated without overlap on the beam profiler 440. In various embodiments, sub-beam images are readily identifiable even when partially overlapping on the beam profiler 440. Thus, even if full sub-image separation on the beam profiler 440 requires, for example, a spectral gap of at least 20%, embodiments of the invention may facilitate identification and alleviation of misalignments even for spectral gaps between emitters of at least 10%, or even at least 5%.

The resulting images from the beam profiler 440 efficiently indicate if and what individual beam emitters (e.g., diode bars) are misaligned. In various embodiments, misalignment (e.g., decentering) in the far-field image may be adjusted or alleviated via tilt adjustment, in the non-WBC dimension, of the corresponding mirror (e.g., interleaver 140 in FIG. 1) for the emitter, as described in the '001 application. In various embodiments, tilt adjustment of the interleaver mirrors may reduce or minimize misalignment (e.g., decentering) in the near-field image as well. In other embodiments, beams aligned in the far field but not in the near field may be aligned via iteratively translating the position of the corresponding SAC lens (e.g., in the slow-axis, non-WBC dimension) and adjusting the tilt of the interleaver mirror 130 in the non-WBC dimension, e.g., as described in the '001 application.

Figure 5D:
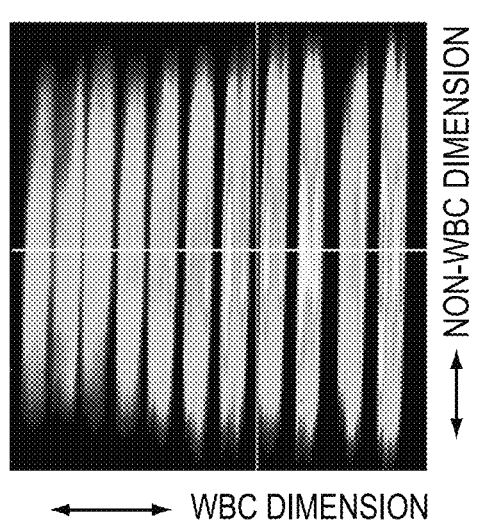

As mentioned above, misalignment in the non-WBC dimension may greatly reduce resonator power and even cause corresponding emitters to emit at unlocked wavelengths. However, unlike conventional lasers, such as solid-state lasers and gas lasers, the use of output power as an alignment indicator for WBC resonators may be largely ineffective, because diodes or emitters in typical WBC resonators operate independently and may each only contribute a small portion of power to the resonator total output. Thus, misalignment of a single diode may be difficult to detect on the basis of total output power. In contrast, optical techniques in accordance with embodiments of the invention effectively reveal misalignment of individual emitters. FIGS. 5C and 5D show example far-field and near-field images, respectfully, with all the sub-beams well-aligned in the non-WBC dimension.

Various embodiments of the invention may automatically align emitters in the non-WBC dimension in response to the images acquired by the beam profiler 440. For example, systems in accordance with embodiments of the invention may include a controller 195 (see FIG. 1) that adjusts the tilt of interleaver mirrors 140 and/or the position (i.e., translation) of SAC lenses 130, at least in the non-WBC dimension, in order to reduce or substantially eliminate misalignment depicted in the images acquired by the beam profiler 440. In accordance with various embodiments, the controller 195 may utilize conventional image processing software or algorithms to measure the alignment or misalignment of the emitters shown in the near-field and far-field images produced by the beam profiler 440 and adjust (e.g., via computer control of tip/tilt stages, stepper motors, etc.) the tilt of interleaver mirrors 140 and/or the position (i.e., translation) of SAC lenses 130 to alleviate the misalignment, as detailed above.

The controller 195 may be provided as either software, hardware, or some combination thereof. For example, the system may be implemented on one or more conventional server-class computers, such as a PC having a CPU board containing one or more processors such as the Pentium or Celeron family of processors manufactured by Intel Corporation of Santa Clara, Calif., the 680x0 and POWER PC family of processors manufactured by Motorola Corporation of Schaumburg, Ill., and/or the ATHLON line of processors manufactured by Advanced Micro Devices, Inc., of Sunnyvale, Calif. The processor may also include a main memory unit for storing programs and/or data relating to the methods described herein. The memory may include random access memory (RAM), read only memory (ROM), and/or FLASH memory residing on commonly available hardware such as one or more application specific integrated circuits (ASIC), field programmable gate arrays (FPGA), electrically erasable programmable read-only memories (EEPROM), programmable read-only memories (PROM), programmable logic devices (PLD), or read-only memory devices (ROM). In some embodiments, the programs may be provided using external RAM and/or ROM such as optical disks, magnetic disks, as well as other commonly used storage devices. For embodiments in which the functions are provided as one or more software programs, the programs may be written in any of a number of high level languages such as PYTHON, FORTRAN, PASCAL, JAVA, C, C++, C#, BASIC, various scripting languages, and/or HTML. Additionally, the software may be implemented in an assembly language directed to the microprocessor resident on a target computer; for example, the software may be implemented in Intel 80×86 assembly language if it is configured to run on an IBM PC or PC clone. The software may be embodied on an article of manufacture including, but not limited to, a floppy disk, a jump drive, a hard disk, an optical disk, a magnetic tape, a PROM, an EPROM, EEPROM, field-programmable gate array, or CD-ROM.

Figure 6A:
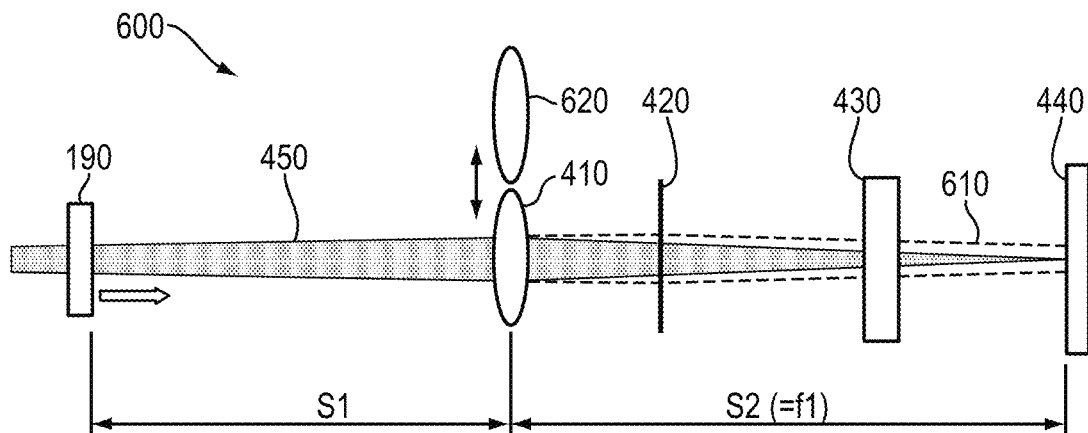
FIG. 6A is a schematic diagram of an alignment system, in the non-WBC dimension, in accordance with embodiments of the invention.
Figure 6B:
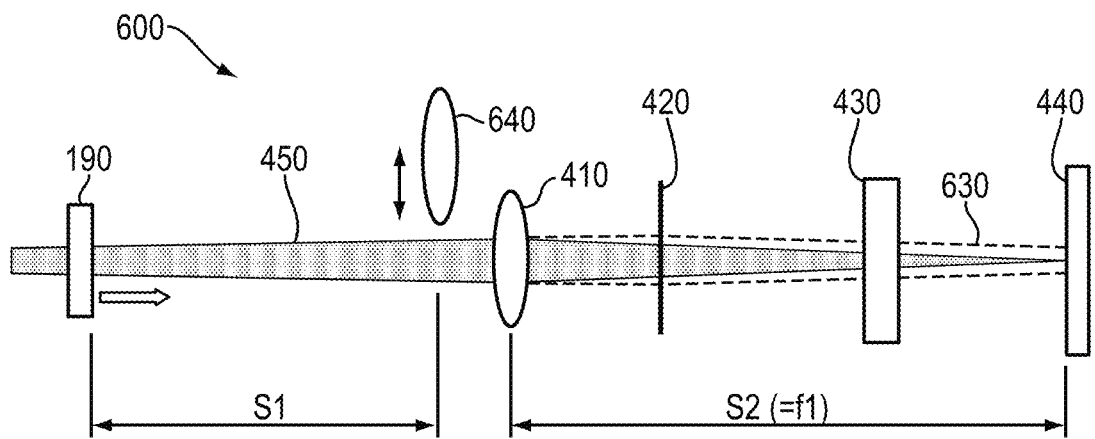
FIG. 6B is a schematic diagram of an alignment system, in the non-WBC dimension, in accordance with embodiments of the invention.

In various embodiments, the near-field image 475 produced by beam profiler 440 in FIG. 4B is a straight projection of the beam 450. Therefore, decentering distances of sub-beam images on the near-field image (e.g., as shown in FIG. 5B) may not directly reflect the actual decentering distances of the corresponding sub-beams on the output coupler of a WBC resonator. This may be addressed via an alignment system 600 in accordance with various embodiments of the present invention as depicted in FIGS. 6A and 6B. In FIG. 6A, a near-field image 610 is obtained by replacing the first lens 410 with a third lens 620 having focal length f3 shorter than f1, which satisfies the lens imaging equation 1/S1+1/S2=1/f3, where S1 and S2 are the distances from lens 620 to the coupler 190 and to the beam profiler 440, respectively. Since S2=f1, then S1=f1×f3/(f1−f3).

In a similar embodiment depicted in FIG. 6B, a near-field image 630 is obtained by adding a third lens 640 having focal length f3, where S1=f3. In various embodiments, as shown in FIG. 6B, the third lens 640 is disposed optically downstream of the beam output (e.g., the coupler 190) and optically upstream of the lens 410. In either of the alignment systems 600 depicted in FIGS. 6A and 6B, the far-field image may be obtained by having only the first lens (or lens set) 410 in place and keeping S2=f1. Since the near-field image 610 or 630 is an image of the beam 450 at the coupler 190, the decentering distances of the sub-beam images on the near-field image will directly and proportionally reflect the decentering distances at the coupler 190 of those sub-beams.

Figure 7A:
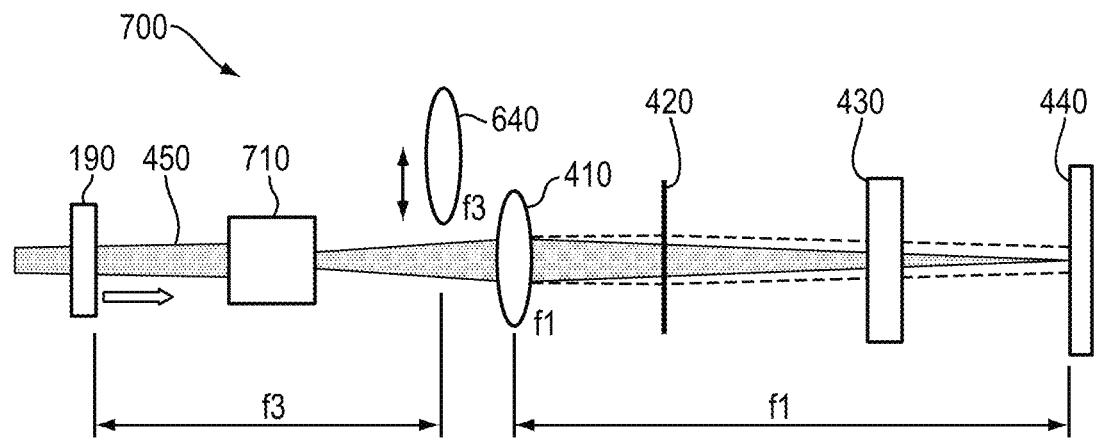
FIG. 7A is a schematic diagram of an alignment system in accordance with embodiments of the invention.

FIG. 7A depicts an alignment system 700 in accordance with various embodiments of the invention that is similar to alignment system 600 of FIG. 6B, but with the addition of a beam rotator 710 disposed optically downstream of the output coupler 190. In various embodiments, the beam rotator 710 rotates the output beam 450 by approximately 90°, and therefore the alignment system 700 will now depict sub-beam misalignment and pointing errors in the WBC direction. In various embodiments, the beam rotator 710 is movable into and out of the path of the beam 450, thereby enabling selection of detection (and resulting alleviation) of misalignment along either the non-WBC dimension or the WBC dimension.

Figure 7B:
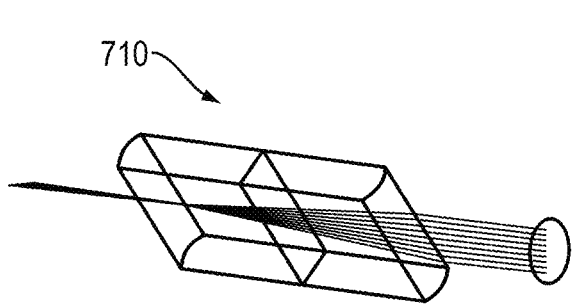
FIGS. 7B-7D are schematic diagrams of exemplary beam rotators in accordance with embodiments of the invention.
Figure 7D:
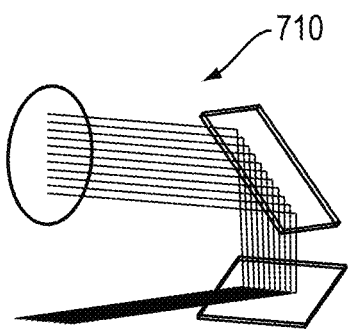
Figure 7C:
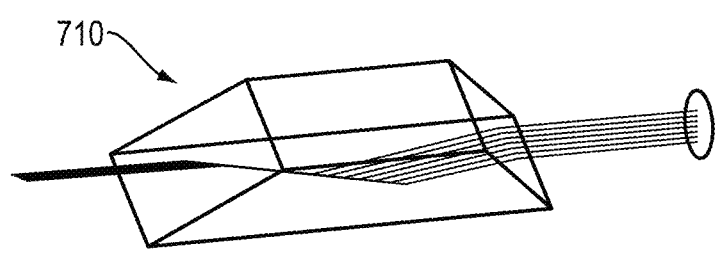

Exemplary beam rotators 710 in accordance with embodiments of the present invention are depicted in FIGS. 7B-7D. For example, FIG. 7B depicts beam rotator 710 as a confocal pair of cylindrical lenses oriented at 45° with respect to the vertical and horizontal dimensions of the beam. FIG. 7C depicts beam rotator 710 as a dove prism oriented at 45° with respect to the vertical and horizontal dimensions of the beam. FIG. 7D depicts beam rotator 710 as a pair of mirrors, where the first mirror reflects the beams 90° in a first plane, and the second mirror reflects the beams 90° in a second plane orthogonal to the first plane.

Figure 8:
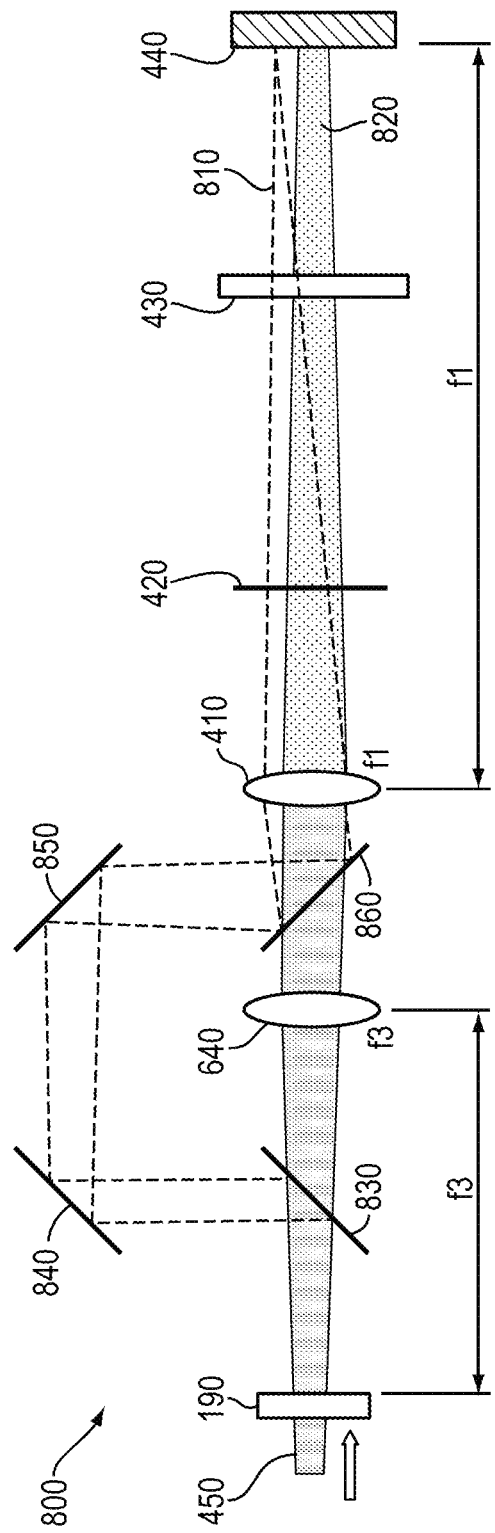
FIG. 8 is a schematic diagram of an alignment system in accordance with embodiments of the invention.

FIG. 8 depicts an alignment system 800 in accordance with embodiments of the invention. In various embodiments, the alignment system 800 obtains a far-field image 810 and a near-field image 820 simultaneously without physical movement of a lens or other optical element. In the illustrated example alignment system 800, the beam 450 is received at beam splitter 830, where it is split so that one portion of the beam propagates through both lenses 640, 410, while the other portion of the beam propagates only through lens 410 (after being redirected around lens 640). Both beam portions then propagate to the beam profiler 440 for display of the near-field and far-field images. As shown in the exemplary embodiment of FIG. 8, one portion of the beam is redirected around lens 640 by reflectors (e.g., mirrors) 840, 850, which then redirect the beam portion to a beam splitter 860 where it rejoins the primary beam path. While FIG. 8 shows two reflectors 840, 850 utilized to redirect the beam portion around lens 640, various embodiments may utilize only one reflector or more than two reflectors to redirect the beam portion.

As shown in FIG. 8, the angle of one or more of the beam splitters and/or reflectors may be adjusted so that the near-field and far-field images do not overlap with each other. In this manner, the near-field and far-field images of the beam 450 may be monitored simultaneously while misalignment of the emitters is reduced or substantially eliminated.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

The invention claimed is:

1. An alignable laser system comprising:
 a laser resonator comprising (i) a plurality of beam emitters for emitting a plurality of input beams, (ii) a plurality of optical elements for manipulating the input beams, and (iii) a beam output, wherein the laser resonator is configured to spatially overlap the input beams along a wavelength-beam-combining (WBC) dimension and output a resulting output beam from the beam output; and
 an alignment system comprising a beam profiler for generating images of the input beams emitted by the beam emitters.

2. The laser system of claim 1, further comprising a controller configured to adjust the optical elements to align the input beams based at least on images generated by the beam profiler.

3. The laser system of claim 2, wherein the optical elements comprise one or more interleaver mirrors and/or one or more collimation lenses.

4. The laser system of claim 3, wherein the controller is configured to adjust the optical elements by tilting one or more said interleaver mirrors and/or translating one or more said collimation lenses.

5. The laser system of claim 3, wherein at least one of the collimation lenses is a slow-axis collimation lens.

6. The laser system of claim 1, wherein the laser resonator comprises:
 a dispersive element for receiving and wavelength-dispersing the input beams, thereby forming a multi-wavelength beam; and
 a partially reflective output coupler for (i) transmitting a first portion of the multi-wavelength beam as the output beam and (ii) reflecting a second portion of the multi-wavelength beam back to the dispersive element.

7. The laser system of claim 6, wherein the laser resonator comprises, associated with each of the beam emitters:
 a fast-axis collimator; and
 an optical rotator for inducing beam rotation of approximately 90°.

8. The laser system of claim 6, wherein the dispersive element comprises a diffraction grating.

9. The laser system of claim 6, wherein the laser resonator comprises:
a plurality of first collimators, each first collimator receiving and collimating one or more beams from one of the beam emitters;
a plurality of interleavers, each interleaver receiving the one or more beams from one of the first collimators; and
a second collimator for receiving all of the beams from the plurality of interleavers, collimating the beams, and transmitting the beams to the dispersive element.

10. The laser system of claim 9, wherein each first collimator comprises a slow-axis collimation lens.

11. The laser system of claim 6, wherein the laser resonator comprises a folding mirror disposed optically downstream of the dispersive element and optically upstream of the partially reflective output coupler.

12. The laser system of claim 6, wherein the partially reflective output coupler is the beam output.

13. The laser system of claim 1, wherein the beam profiler is disposed optically downstream of the beam output.

14. The laser system of claim 1, wherein the alignment system comprises:
a dispersive element for receiving the output beam and dispersing the output beam to generate a plurality of dispersed beams in the WBC dimension;
disposed optically downstream of the beam output and optically upstream of the beam profiler, a first lens having optical power in a non-WBC dimension perpendicular to the WBC dimension; and
disposed optically downstream of the dispersive element and optically upstream of the beam profiler, a second lens, having optical power in the WBC dimension, for focusing the dispersed beams on the beam profiler,
wherein the beam profiler is configured to receive the plurality of dispersed beams and generate images of the relative positions of the dispersed beams received by the beam profiler.

15. The laser system of claim 14, wherein the first lens is movable between (i) a first position within a path of the output beam to thereby generate a far-field image via the beam profiler, and (ii) a second position outside the path of the output beam, whereby a near-field image is generated via the beam profiler.

16. The laser system of claim 14, wherein:
the alignment system comprises a third lens;
a focal length of the third lens is less than a focal length of the first lens; and
the first lens and the third lens are interchangeable within a path of the output beam such that (i) when the first lens is within the path of the output beam a far-field image is generated via the beam profiler and (ii) when the third lens is within the path of the output beam a near-field image is generated via the beam profiler.

17. The laser system of claim 14, wherein the alignment system comprises a third lens disposed optically downstream of the beam output and optically upstream of the first lens.

18. The laser system of claim 17, wherein a focal length of the third lens is less than a focal length of the first lens.

19. The laser system of claim 17, wherein the third lens is movable between (i) a first position within a path of the output beam to thereby generate a near-field image via the beam profiler, and (ii) a second position outside the path of the output beam, whereby a far-field image is generated via the beam profiler.

20. The laser system of claim 14, wherein the alignment system comprises a beam rotator disposed optically downstream of the beam output.

21. The laser system of claim 20, wherein the beam rotator is configured to rotate the output beam by approximately 90°.

22. The laser system of claim 20, wherein the beam rotator comprises (i) two confocal cylindrical lenses, (ii) a dove prism, or (iii) two reflectors.

23. The laser system of claim 1, wherein the alignment system is configured to de-multiplex the output beam before the beam profiler generates images of the input beams.

24. The laser system of claim 1, wherein the beam profiler comprises a plurality of photoresponsive image sensors.

25. The laser system of claim 1, wherein the beam profiler comprises a camera.

26. The laser system of claim 1, wherein the beam profiler includes or is operatively coupled to a display configured to generate images of the input beams emitted by the beam emitters.

27. The laser system of claim 1, wherein the beam profiler comprises a screen upon which the images of the input beams are displayed.

* * * * *